United States Patent [19]

Sahasrabudhe et al.

[11] 4,016,517

[45] Apr. 5, 1977

[54] SIGNAL BANDPASS FILTER APPARATUS

[75] Inventors: Arun P. Sahasrabudhe, Monroeville; Thomas C. Matty, North Huntingdon, both of Pa.

[73] Assignee: Westinghouse Electric Corporation, Pittsburgh, Pa.

[22] Filed: Aug. 14, 1975

[21] Appl. No.: 604,740

[52] U.S. Cl. .............................. 333/71; 246/34 R; 333/72

[51] Int. Cl.² ................. H03H 9/02; H03H 9/26; B60Q 11/00

[58] Field of Search ............ 333/30 R, 72, 71, 17; 324/51–54; 340/147 R, 147 P; 246/7, 29 R, 30, 34 R, 34 B, 114 R, 176, 187 R, 219, 220

[56] References Cited

UNITED STATES PATENTS

| 2,832,930 | 4/1958 | Hays | 324/53 |
| 3,931,600 | 1/1976 | Nagashima et al. | 333/71 |

Primary Examiner—Alfred E. Smith
Assistant Examiner—Marvin Nussbaum
Attorney, Agent, or Firm—R. G. Brodahl

[57] ABSTRACT

A signal bandpass filter apparatus is disclosed wherein a direct short circuit between input and output is prevented and the loss of the ground reference of the filter is detectable and fail-safe in operation.

7 Claims, 6 Drawing Figures

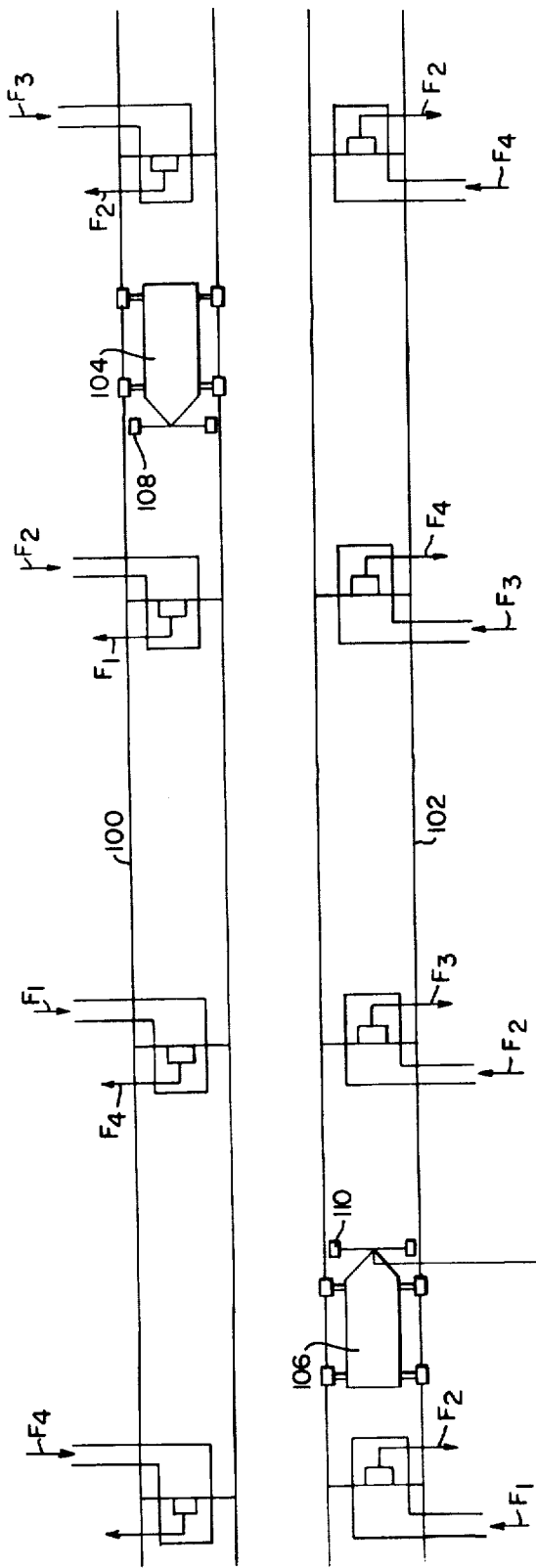
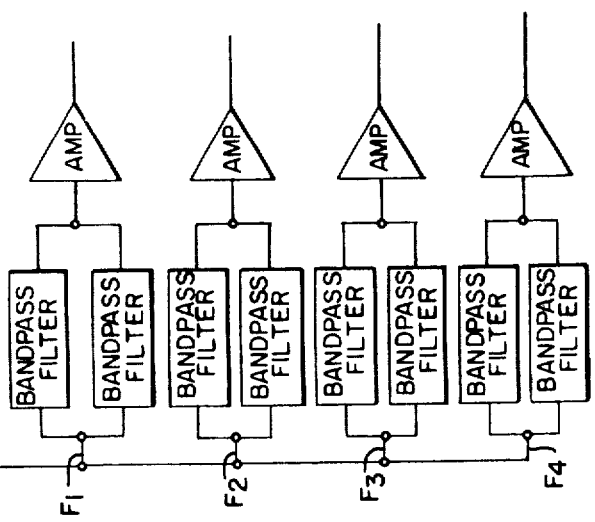
FIG.5 *PRIOR ART*

SIGNAL BANDPASS FILTER APPARATUS

BACKGROUND OF THE INVENTION

It is known in the prior art to use signal bandpass filters in communication systems to pass a known frequency signal and to prevent the passage of extraneous signals. In fail-safe communication systems it is desired to set the system signal threshold sensitivity to a predetermined level in a fail-safe manner, which requires that the signal gain ahead of the threshold reference must be fail-safe and therefore must not increase due to any failure. Similarly, any signal loss ahead of the threshold reference must be fail-safe and therefore must not decrease due to any failure. The two more common filter failures that can result in the reduction of the signal insertion loss of a filter are a short circuit from input to output and an open circuit of the ground reference of the filter.

A train vehicle control signal, for example a vehicle speed demand, can be binary coded such that a binary 'one' indication is at a first frequency and a binary 'zero' indication is at a second frequency. Respective bandpass filters can be employed to pass these frequencies to remove noise and achieve the desired selectivity, as illustrated in U.S. Pat. No. 3,810,161 of A. P. Sahasrabudhe, U.S. Pat. No. 3,775,750 of D. H. Woods, and U.S. Pat. No. 3,562,712 of G. M. Thorne-Booth et al. A signal receiver carried by the vehicle is operative to select the desired speed signal from the track signal block occupied by the vehicle to result in energizing the propulsion motors to move the vehicle along the track at an actual speed in accordance with said desired speed. It is known to use a crystal filter as a signal bandpass filter but such a crystal filter has a limited reliability and is a very complicated device. It requires substantial tuning of the crystal in associated circuits for impedance matching, and is expensive to obtain. To provide a low frequency and fail-safe signal bandpass filter, it is desired that the signal from a signal source of necessity passes through the filter.

It is known in the prior art to provide a low frequency mechanical bandpass filter device having an input and output electrically wired through a first piezoelectric transducer coupled to a first resonant bar, with a mechanical coupling provided between the first resonant bar and the second resonant bar, and a second piezoelectric transducer device coupled to the second resonant bar. A common connection is made to each resonant bar and if that common connection should break, or a short occur through one of the piezoelectric transducers, then direct electrical coupling might happen to make the device no longer fail-safe, with the occurrence of such a failure mode operating to bypass the narrow band filter effect and turn the device into the equivalent of a substantially wideband connector wire.

SUMMARY OF THE INVENTION

According to the teachings of the present invention, a signal bandpass filter apparatus is provided including an input signal receiving electrical to mechanical first energy conversion apparatus operative with an output signal providing mechanical to electrical second energy conversion apparatus, with a direct current path being provided to include the signal resonator members in each of the first energy conversion apparatus and the second energy conversion apparatus. The signal resonator members are resonant in relation to the known frequency of the input signal.

BRIEF DESCRIPTION OF THE DRAWING

FIG. 5 is a schematic showing of a well-known train vehicle signal system arrangement for controlling the movement of train vehicles and suitable for operation with the present filter apparatus.

DESCRIPTION OF THE PREFERRED EMBODIMENT

Figure 1:
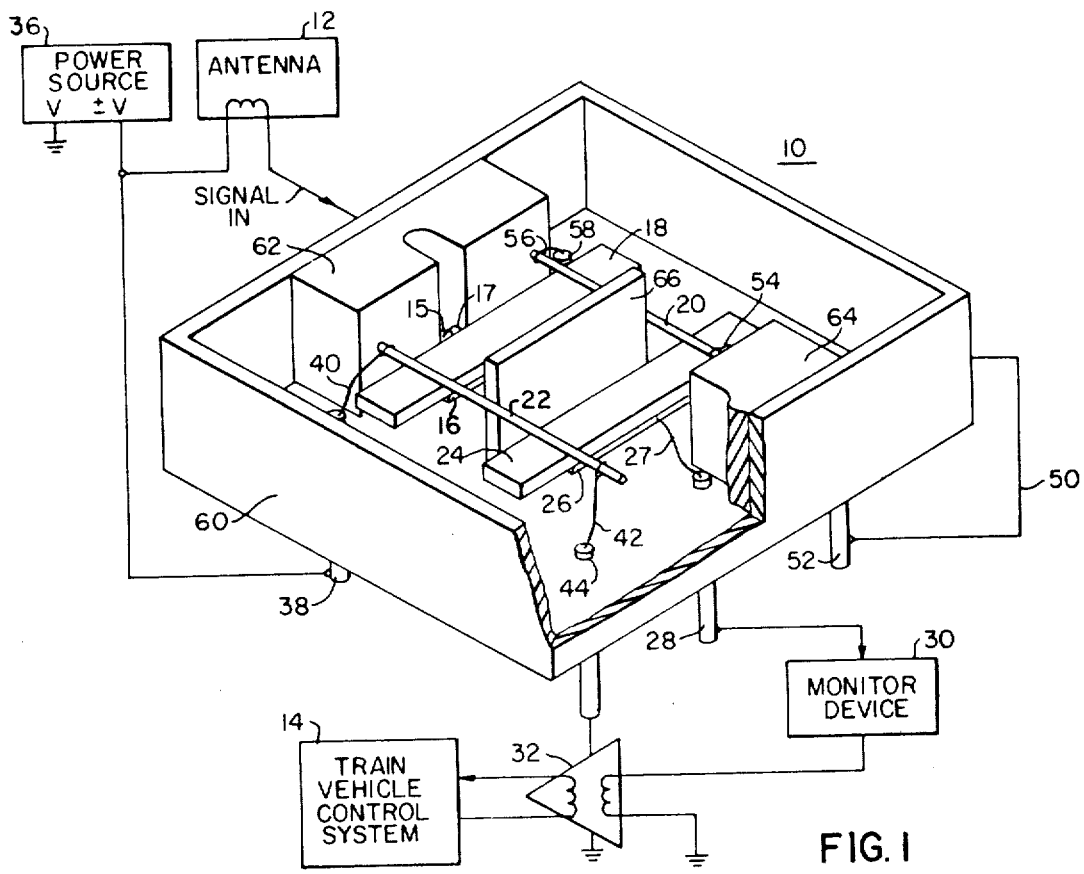
FIG. 1 is an illustrative showing of the present signal bandpass filter apparatus operative with a train vehicle control system.

In FIG. 1 there is shown the signal bandpass filter apparatus 10 of the present invention connected between an input signal providing antenna 12 and a train vehicle control system 14. The signal bandpass filter 10 includes a first piezoelectric transducer 16 coupled to a first resonator bar 18. The first resonator bar 18 is mechanically coupled through connectors 20 and 22 to a second resonator bar 24. A second piezoelectric transducer 26 is coupled to the second resonator bar 24. An electrical input signal from the antenna 12 passes through the first piezoelectric transducer 16 from which it goes as a mechanical signal into the first resonator bar 18. The mechanical signal passes through the connections 20 and 22 into the second resonator bar 24 and then is supplied to the second piezoelectric transducer 26 where it is changed back to an electrical signal and passes through an output terminal pin 28, a monitor device 30 and an amplifier 32 to the train vehicle control system 14. The input signal from the antenna 12 is connected to an input terminal pin 15 and a connection wire 17 connected to the first piezoelectric transducer 16. The second piezoelectric transducer 26 is connected through a connection wire 27 to the output terminal pin 28. A DC power source 36 is connected to a terminal pin 38 and a connection wire 40 to the connector 22 and through a connection wire 42 to the terminal pin 44, which is operative to supply the DC operating voltage for the amplifier 32. A connection 50 is made between a terminal pin 52 connected through a wire 54 to the connector 20 and a connection wire 56 to the terminal pin 58 operative with the connection 50. The signal bandpass filter 10 is supported by a case 60 including a first support grommet 62 and a second support grommet 64 and an insulating partition 66. The input signal voltage from the antenna 12 is applied to the first piezoelectric transducer 16 and the first resonant bar 18. The output signal voltage is taken from the second piezoelectric transducer 26 and the second resonant bar 24. In order to provide a ground return as well as an integrity monitor check, the voltage source 36 is connected between the first resonant bar 18 and the second resonant bar 24 through the connector 22, with the DC power source 36 being utilized to monitor the filter apparatus integrity and to alarm or shut down the filter operation in the event of a detected failure of the filter apparatus 10. The high frequency input signal, such as a speed coded signal, from the antenna 12 passes through the filter 10 to the train vehicle control system 14 as a load, and the direct current monitoring voltage from the signal source 36 is electrically connected through the first resonant bar 18 to the mechanical connector 22 and the second resonant bar 24.

In the operation of the bandpass filter 10, if any connection wires, such as wires 40 or 42 should break, this failure is detectable as is an electrical short through the bandpass filter 10. The bandpass filter 10 takes a count of the possible failure modes such that at no time will an effective wideband filter be provided upon some failure of the apparatus. The integrity of the filter is checked continuously and the only signal available to the load 14 is the narrow bandpass input signal. The input signal from the antenna 12 goes to the terminal pin 15, with the wire 17 being connected between the terminal pin 15 and the piezoelectric transducer 16 and having a minimum length to assure it cannot break loose and physically reach the resonant bar 18. The reasonant bar 18 is mechanically coupled to the resonant bar 24 through the connector 22 and the connector 20. The output signal is connected from the piezoelectric transducer 26 of the terminal pin 28 through the connecting wire 27, with the connecting wire 27 having a minimum length such that should it break, it cannot physically reach the resonant bar 24. The physical arrangement of the bandpass filter apparatus 10 is such that the plastic partition 66 provides an electrical insulating wall to separate the input resonator bar 18 from the output resonator bar 24. The housing 60 and the plastic partition 66 are made of electrically insulating plastic. The input and output connection wires 17 and 27 are kept small and at a minimum length such that they cannot accidently short circuit and connect to each other. The DC power source 36 is connected through the resonator bar 18 to the resonator bar 24, with the power being taken from the output resonator bar 24 through the connection 42 to the terminal pin 44 for supplying DC voltage to the amplifier 32. If the ground reference should disconnect, the power connection between the power source 36 and the amplifier 32 is open thereby disabling the passage of the input signal from the antenna 12 through the amplifier 32 to the train vehicle control system 14, since the amplifier 32 is no longer operative.

Figure 2:
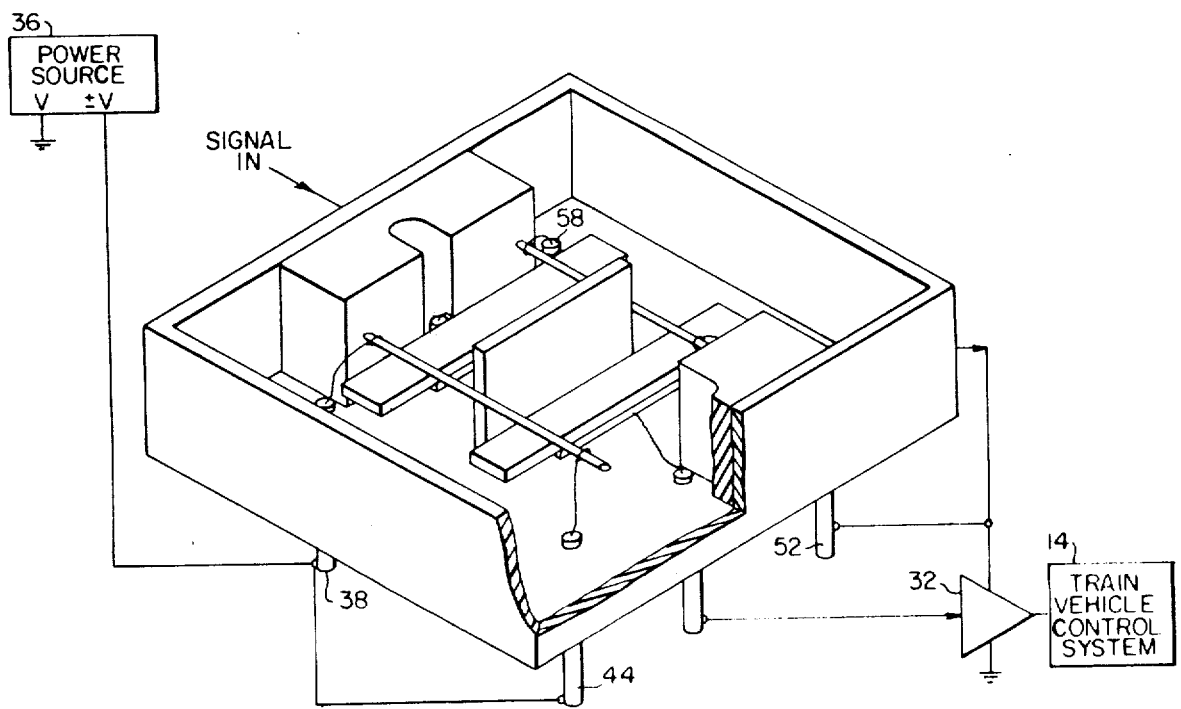
FIG. 2 shows a modification of the present signal bandpass filter apparatus.

In FIG. 2 there is shown a modification of the present signal bandpass filter apparatus, whereby DC power source 36 and the terminal pin 38 are electrically connected to the terminal pin 44. The terminal pin 52 is electrically connected in a circuit with the terminal pin 58, with the latter circuit being connected for providing the DC power to the amplifier 32.

Figure 3:
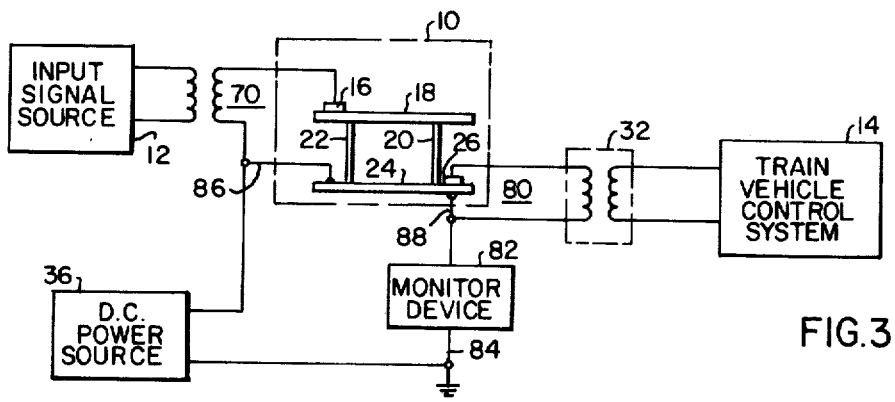
FIG. 3 is a schematic showing of the present signal bandpass filter apparatus operative with a train vehicle control system.

In FIG. 3 there is a schematic showing of the present signal bandpass filter apparatus operative with a train vehicle control system 14, and illustrating how the input signal source or antenna 12 provides an input signal through the input piezoelectric transducer 16 and the input resonant bar 18. The resonant bar 18 is mechanically coupled through the connectors 22 and 20 to the output resonant bar 24 operative with the piezoelectric transducer 26 for providing an output signal through the amplifier 32 to the train vehicle control system 14. As shown in FIG. 3, the DC power source 36 is connected between the conductor 86 of the input circuit 70 and the output conductor 84 through a monitor device 82, with the conductor 84 being connected to ground. In this way, should there be a failure in the conductor 86 of the input circuit 70 or a failure in the conductor 88 of the output circuit 80, the monitor device 82 will respond to such a failure and provide an indication of that failure. In addition, should the conductor 86 fail or the conductor 88 fail, the respective input circuit 70 and output circuit 80 will not transmit the input signal from the source 12 through the bandpass filter apparatus 10 to the train vehicle control system 14.

Figure 4:
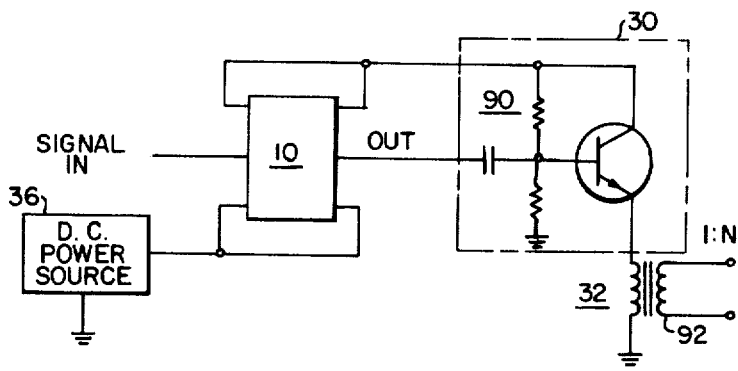
FIG. 4 is a schematic showing of the electrical circuit arrangement including the present signal bandpass filter, an operation monitor device, and an output signal amplifier.

In FIG. 4 there is provided a schematic showing of the electrical circuit arrangement including the present signal bandpass filter 10, the operation monitor device 30 and an output signal amplifier 32, with the signal bandpass filter 10 being operative to pass an output signal to the emitter follower 90 and with the transformer 92 providing the desired signal voltage gain. The DC voltage supply 36 is connected through the filter 10 to the collector of the transistor in the emitter follower 90. The transistor can function as the DC monitoring device 30 with the output transformer 92 providing the desired signal voltage gain of the amplifier 32.

FIG. 5 is a schematic showing of a well-known train vehicle signal system for controlling the movement of train vehicles, and includes a first track 100 and an adjacent second track 102. The illustration shown in FIG. 5 includes four carrier frequency signals F1, F2, F3 and F4 to space the carrier frequencies in one track in relation to the adjacent track same carrier frequencies such that the carrier frequency in any signal block of respective one track is spaced away from the use of the carrier frequency in the adjacent track to minimize cross-talk between the track signal blocks controlling the movement of the train vehicles 104 and 106. Each carrier includes a pair of frequencies, for example F1 can be 5183 Hertz for binary one and 7775 Hertz for binary zero, F2 can be 5841 Hertz for binary one and 8864 Hertz for binary zero, carrier signal F3 can be 6623 Hertz for binary one and 9935 Hertz for binary zero, and carrier signal F4 can be 5399 Hertz for binary one and 8399 Hertz for binary zero, as generally disclosed in U.S. Pat. No. 3,532,877 of G. M. Thorne-Booth et al. A train vehicle control system typically using a six bit, comma-free speed code signal for representing desired speed commands to the train vehicle may provide eight operational speeds such as from 0 to 100 kph within a given signal block. The respective speed signals are represented by different coded signals which may be 000001 for zero speed transmitted in frequency shift keyed modulation as well known to persons skilled in this art. Each vehicle such as 104 and 106 carries an antenna 108 and 110 respectively, which passes from the track in a given signal block the speed signal, which passes through two bandpass filters. One bandpass filter is centered at the binary zero frequency and the other bandpass filter is centered at the binary one frequency. Thusly, a carrier pair of frequencies requires two bandpass filters, such as shown for each of F1, F2, F3 and F4 and as shown in U.S. Pat. No. 3,810,161 of A. P. Sahasrabudhe. The bandpass filter apparatus shown in FIG. 1 is suitable for operation in relation to either frequency of a particular carrier pair of frequencies operative with a given signal block. The actual speed code is established by the time occurrence as well as the number of the zero bits and the number of the one bits in the received input signal. The carrier transmits the signal bits to the receiver for controlling the train vehicle operation, in consideration of the threshold energy content of the signals and so forth, as well known to persons skilled in this art. The train vehicle carries four pairs of bandpass filters of the type shown in FIG. 1. The mechanical resonant characteristics of the filter apparatus determine the shape of the signal bandpass in accordance with the resonant frequency of the metal bars and the transfer characteristics of the piezoelectric ceramic transducers, such as described in a publication in the 1974 Ultrasonics Symposium Proceedings of the IEEE at pages 599 through 602 and entitled "Characteristics Of Low Frequency Mechanical Filters" by D. P. Havens and P. Ysais, and in a publication in the Electronic Design News for October 5, 1973 at pages 22 through 30 entitled "Passive Filters: Todays's Offerings And Tomorrow's Promises" by E. M. Frymoyer et al, and in a publication in the 1973 Proceedings of ISCT at pages 402 through 405 entitled "Mechanical Filters" by R. A. Johnson.

In relation to the bandpass filter apparatus shown in FIG. 1, the weakest portion of the filter apparatus 10 in relation to failure appears to be the connection wires 40, 17, 56, 54, 27 and 42, having limited current carrying capacity. Since the DC bias voltage passes through the resonator bars 18 and 24, the current drawn by the subsequent load apparatus such as the amplifier 32 is also going to flow through the same connection wires and the associated terminal posts 38, 15, 58, 52, 28 and 44. If any of these connection wires should break for some reason, this can result in loss of DC power.

The modification shown in FIG. 2 may provide a more reliable arrangement of DC monitoring signal conduction paths, with the monitoring signal now being shared by each resonator bar 18 and 24 and so forth. If one connection wire is broken, the DC power continues to be supplied to the subsequent load apparatus 32 and the reliability is better since two wires or more must be broken before the operation of the amplifier 32 is thereby stopped.

Figure 6:
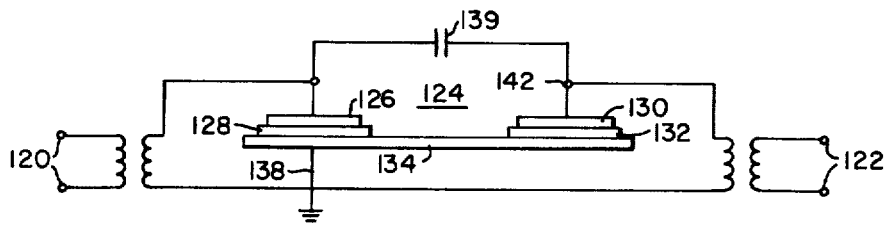
FIG. 6 is a schematic showing of a well known prior art signal bandpass filter apparatus.

In FIG. 6 there is a schematic showing of prior art signal bandpass filter apparatus with the input signal being supplied to terminals 120 and the output signal being removed from terminals 122. The bandpass filter apparatus 124 includes a first piezoelectric transducer 126 mounted on a first resonator bar 128 and a second piezoelectric transducer 130 mounted on a second resonator bar 132. Mechanical connectors 134 are connected between the first resonator bar 128 and the second resonator bar 132. The input signal is supplied between the first piezoelectric transducer 26 and the second resonator bar 132. The output signal is removed from the second resonator bar 132 and the second piezoelectric transducer 130. If for some reason the signal ground reference connection 138 is broken, the mechanical filter no longer has a ground reference at the output side, and the coupling connectors 134 would transfer mechanical vibrations between the input resonator bar 128 and the output resonator bar 132, but no transfer to the piezoelectric transducer 130 in that the circuit including the piezoelectric transducer 130 is interrupted. In addition, there is a capacitive coupling 139 from the connection 140 to the connection 142 around the bandpass filter apparatus 124 which can effectively provide an increased amplitude wave shape having an undesired bandpass width to a subsequent amplifier, and such a signal can appear to have grown bigger and this means more gain to reduce the signal threshold of the train vehicle control system. This is a trend toward unsafe operation and would not be detectable because the system continues to operate.

We claim as our invention:

1. In a signal bandpass filter apparatus operative with an input signal having a predetermined frequency and a load device, the combination of:

first means responsive to said input signal for providing a first electrical to mechanical energy conversion;

second means operative with said first means for providing a second mechanical to electrical energy conversion;

third means operative with said second means for providing an output signal to said load device; and fourth means connected to supply a direct current voltage signal through said first means and through said second means for determining the operational integrity of said apparatus by disabling the passage of said input signal to said load device when a predetermined failure of said apparatus occurs.

2. The apparatus of claim 1, including electrical insulating means positioned between said first means and said second means.

3. The apparatus of claim 1, with said first means including a piezoelectric transducer operative with a physically resonant member having a predetermined resonant characteristic in relation to the frequency of said input signal.

4. The apparatus of claim 1, with said first means including a first piezoelectric transducer operative with a first physically resonant member, with said second means including a second physically resonant member operative with a second piezoelectric transducer.

5. The apparatus of claim 1, including fifth means operative with said first means and said second means for physically coupling energy from said first means to said second means.

6. In a signal bandpass filter apparatus for passing an input electrical signal having a predetermined frequency to a load, the combination of:

first means responsive to said input electrical signal and including a first piezoelectric transducer operative with a first mechanical member resonant at said frequency;

second means coupled with said first means for providing an output electrical signal to said load and including a second piezoelectric transducer operative with a second mechanical member resonant at said frequency; and third means connected to each of said first means and said second means and providing a direct current signal through each of said first and second means for determining the integrity of said apparatus by controlling the passage of said input electrical signal to said load.

7. The apparatus of claim 6, with said third means providing a direct current voltage signal continuously through each of said first means and said second means for determining said integrity by disabling the passage of said input electrical signal to said load upon the occurrence of a predetermined failure of said apparatus.

* * * * *